United States Patent
Engl et al.

(10) Patent No.: US 9,620,680 B2
(45) Date of Patent: Apr. 11, 2017

(54) OPTOELECTRONIC SEMICONDUCTOR BODY

(75) Inventors: Karl Engl, Pentling (DE); Matthias Sabathil, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 182 days.

(21) Appl. No.: 13/123,713

(22) PCT Filed: Sep. 30, 2009

(86) PCT No.: PCT/DE2009/001379
§ 371 (c)(1),
(2), (4) Date: Oct. 27, 2011

(87) PCT Pub. No.: WO2010/040337
PCT Pub. Date: Apr. 15, 2010

(65) Prior Publication Data
US 2012/0043572 A1 Feb. 23, 2012

(30) Foreign Application Priority Data
Oct. 9, 2008 (DE) .................. 10 2008 051 048

(51) Int. Cl.
*H01L 33/00* (2010.01)
*H01L 33/38* (2010.01)
(Continued)

(52) U.S. Cl.
CPC ............ *H01L 33/382* (2013.01); *H01L 33/22* (2013.01); *H01L 33/62* (2013.01); *H01L 2924/0002* (2013.01)

(58) Field of Classification Search
CPC ............ H01L 23/5384; H01L 23/5226; H01L 23/481; H01L 23/53209
(Continued)

(56) References Cited

U.S. PATENT DOCUMENTS 5,626,686 A * 5/1997 Yoshida .................. 136/244
5,917,202 A * 6/1999 Haitz .................. H01L 33/405
257/98
(Continued)

FOREIGN PATENT DOCUMENTS

CN 1922733 2/2007
DE 10 2005 007 601 9/2005
(Continued)

OTHER PUBLICATIONS

Machine translation, Ichikawa, Japanese Pat. Pub. No. JP 2007-287849 (translation date: Feb. 27, 2014), JPO & Japio, all pages.*
(Continued)

*Primary Examiner* — Victoria K Hall
(74) *Attorney, Agent, or Firm* — Cozen O'Connor

(57) ABSTRACT

An optoelectronic semiconductor body for emitting electromagnetic radiation from the front side with a semiconductor layer sequence and a first electrical contact layer, wherein the semiconductor layer sequence comprises at least one opening that penetrates fully through the semiconductor layer sequence in the direction from the front side to the rear side that is opposite the front side, the first electrical contact layer is arranged at the rear of the semiconductor body, a section of the first electrical contact layer extends from the rear side through the opening to the front side and covers a first sub-region of a front-side main face of the semiconductor layer sequence, and a second sub-region of the front-side main face is not covered by the first electrical contact layer.

19 Claims, 3 Drawing Sheets

(51) Int. Cl.
*H01L 33/22* (2010.01)
*H01L 33/62* (2010.01)

(58) Field of Classification Search
USPC .... 257/E33.062, E33.065, E33.066, 79–103, 257/E33.001–E33.055, 749, 773–775; 438/22–47
See application file for complete search history.

(56) References Cited

U.S. PATENT DOCUMENTS

| | | | | |
|---|---|---|---|---|
| 6,111,272 | A | 8/2000 | Heinen | |
| 7,119,372 | B2* | 10/2006 | Stokes | H01L 33/405 257/103 |
| 7,622,746 | B1* | 11/2009 | Lester | H01L 33/387 257/98 |
| 7,683,380 | B2* | 3/2010 | Lee | H01L 33/0079 257/13 |
| 8,026,527 | B2* | 9/2011 | Hasnain | H01L 33/382 257/100 |
| 8,143,636 | B2* | 3/2012 | Lin | H01L 33/42 257/100 |
| 8,692,280 | B2* | 4/2014 | Yeh | H01L 31/02005 257/776 |
| 9,054,016 | B2* | 6/2015 | Moosburger | H01L 27/15 |
| 9,362,456 | B2* | 6/2016 | Chen | H01L 31/02240 |
| 2001/0025955 | A1* | 10/2001 | Okushi | H01L 21/0405 257/21 |
| 2002/0017652 | A1 | 2/2002 | Illek et al. | |
| 2002/0070913 | A1* | 6/2002 | Kimura | G09G 3/3233 345/92 |
| 2004/0217360 | A1 | 11/2004 | Negley | |
| 2005/0104081 | A1* | 5/2005 | Kim | H01L 33/382 257/99 |
| 2005/0184305 | A1* | 8/2005 | Ueda | H01L 33/08 257/99 |
| 2005/0205883 | A1 | 9/2005 | Wierer | |
| 2005/0258436 | A1* | 11/2005 | Arai | H01L 33/382 257/81 |
| 2005/0270464 | A1* | 12/2005 | Seo | H01L 51/5203 349/139 |
| 2006/0231852 | A1* | 10/2006 | Kususe | H01L 24/06 257/99 |
| 2007/0221927 | A1* | 9/2007 | Chen | H01L 33/22 257/79 |
| 2008/0006842 | A1* | 1/2008 | Seong | H01L 33/22 257/99 |
| 2008/0111484 | A1* | 5/2008 | Kwon et al. | 313/506 |
| 2008/0121903 | A1* | 5/2008 | Hiramatsu | H01L 21/0237 257/89 |
| 2008/0164457 | A1* | 7/2008 | Furukawa | H01L 33/38 257/13 |
| 2008/0191215 | A1* | 8/2008 | Choi | H01L 33/382 257/76 |
| 2008/0241526 | A1 | 10/2008 | Ou et al. | |
| 2008/0251785 | A1* | 10/2008 | Noh | H01L 27/12 257/40 |
| 2009/0039359 | A1* | 2/2009 | Yoon | H01L 33/382 257/88 |
| 2009/0065800 | A1* | 3/2009 | Wirth et al. | 257/100 |
| 2009/0267092 | A1* | 10/2009 | Fukshima | H01L 33/20 257/98 |
| 2010/0032699 | A1* | 2/2010 | Lee | B32B 37/1018 257/98 |
| 2010/0038669 | A1* | 2/2010 | McKenzie | H01L 33/405 257/98 |
| 2010/0038699 | A1* | 2/2010 | Katsumata et al. | 257/324 |
| 2010/0071936 | A1* | 3/2010 | Tan | H05K 1/0204 174/252 |
| 2010/0123153 | A1* | 5/2010 | Lin | H01L 33/46 257/98 |
| 2010/0171135 | A1 | 7/2010 | Engl et al. | |
| 2010/0187559 | A1* | 7/2010 | Han | H01L 33/20 257/99 |
| 2013/0264563 | A1* | 10/2013 | Okazaki et al. | 257/43 |
| 2016/0260870 | A1* | 9/2016 | Maute | H01L 33/382 |

FOREIGN PATENT DOCUMENTS

| | | | | |
|---|---|---|---|---|
| DE | 10 2007 022 947 | | 10/2008 | |
| EP | 0905797 | | 3/1999 | |
| EP | 1 383 177 | | 1/2004 | |
| EP | 1 577 958 | | 9/2005 | |
| JP | 2007-523483 | | 8/2007 | |
| JP | 2007-273975 | | 10/2007 | |
| JP | 2007-287249 | * | 11/2007 | H01L 33/00 |
| JP | 2007-287849 | * | 11/2007 | H01L 33/00 |
| TW | 200703707 | | 1/2007 | |
| WO | WO 02/13281 | | 2/2002 | |
| WO | WO 2005/081319 | | 9/2005 | |
| WO | WO 2005/091388 | | 9/2005 | |
| WO | WO 2007/001124 | | 1/2007 | |
| WO | WO 2007/105626 | | 9/2007 | |

OTHER PUBLICATIONS

Machine translation, Ichikawa, Japanese Pat. Pub. No. 2007-287849, translation date: Feb. 27, 2014, JPO & Japio, all pages. (reference provided with Mar. 11, 2014 office action).*

I.Schnitzer et al., "30% External Quantum Efficiency From Surface Textured, Thin-film Light-emitting Diodes", Appl. Phys. Lett. 63 (16), Oct. 18, 1993, pp. 2174-2176.

* cited by examiner

OPTOELECTRONIC SEMICONDUCTOR BODY

RELATED APPLICATIONS

This is a U.S. national stage of application No. PCT/DE2009/001379, filed on Sep. 30, 2009.

This patent application claims the priority of the German Patent Application 102008051048.3, filed Oct. 9, 2008, the disclosure content of which is hereby incorporated by reference.

FIELD OF THE INVENTION

The present application relates to an optoelectronic semiconductor body.

SUMMARY OF THE INVENTION

It is an object of the present application to provide an optoelectronic semiconductor body which exhibits a particularly high overall efficiency and/or is particularly cost-effective to manufacture.

An optoelectronic semiconductor body which comprises a semiconductor layer sequence is provided for. The semiconductor layer sequence includes an active layer suitable for generating electromagnetic radiation. The active layer contains a p-n junction, a double-heterostructure or a quantum well structure such as a single quantum well (SQW) structure or a multi quantum well (MQW) structure for generating radiation.

The semiconductor layer sequence comprises at least one opening. The opening extends all the way through the semiconductor layer sequence from a front side to a rear side that is opposite the front side. Expressed differently, the semiconductor layer sequence comprises an cut-out such as a hole that extends over the full thickness of the semiconductor layer sequence. The thickness refers here to the distance across the semiconductor layer sequence measured from the front side to the rear side.

The optoelectronic semiconductor body is designed to emit electromagnetic radiation from a front side. A first electrical contact layer is located at the rear side of the semiconductor body. For example, in top view of the rear side, it covers the semiconductor layer sequence completely or in places. A section of the first electrical conducting layer extends from the rear side through the opening of the semiconductor layer sequence to the front side, and covers a first sub-region of a front-side main face of the semiconductor layer sequence.

In a preferred embodiment, the semiconductor layer sequence has a plurality of openings which are, for example, arranged at the nodes of a rectangular, square or hexagonal grid in top view of the semiconductor body. In the case of a semiconductor body with a plurality of openings, each opening is associated with one section of the first electrical contact layer that passes through the opening. In addition, each opening is associated with one first sub-region of the front-side main face that is covered by the respective section.

In an expedient embodiment, a separating layer is arranged in the opening, or at least in a rear-side sub-region of the opening, the separating layer insulating the section of the first electrical contact layer from the semiconductor layer sequence. In this way, the risk of a short-circuit of the active layer by the section of the first electrical contact layer, which section is arranged in the opening and passes through a break-through in the active layer, is reduced. The separating layer can be formed integrally with the first electrical contact layer, for example by means of oxidation of an edge region of a first electrical contact layer which contains a metal. Preferably, the separating layer is distinct from the first electrical contact layer. It comprises, for example, a dielectric material, or consists of one. It contains, for example, silicon dioxide or a silicon nitride, or consists of one of these materials.

The front-side external electrical contact of the semiconductor body can be established from its rear side by means of the first electrical contact layer. An electrical contact layer for the purposes of external electrical contact—such as a bond pad—is advantageously not necessary on the radiation-emitting front side. An external electrical contact layer of this sort usually reduces the efficiency of the semiconductor body, for example because it prevents the output of a portion of the radiation emitted by the active layer.

In one embodiment the electrical contact layer entirely covers the front-side main face. In an alternative embodiment, a second sub-region of the front-side main face is not covered by the first electrical contact layer. In particular, the second sub-region is not covered by any electrically conductive layer in top view of the front-side main face. For example, the second sub-region of the front-side main face represents an exposed outer surface of the semiconductor body. It is also conceivable that, in top view of the front-side main face, the second sub-region is covered by one or more layers that, in particular, are radiation-transmissive. In this case in particular the layer, or each of the layers which cover the second sub-region in top view of the front-side main face, is electrically insulating.

In a further development, the quotient of the surface area of a front-side contact surface and the total surface area of the front-side main face has a value greater than or equal to 0.05. Alternatively, or in addition, it has a value of less than or equal to 0.15. The expression "front-side contact surface" denotes the surface area enclosed by the outer boundary of the first sub-region. If there is more than one first sub-region, the expression "front-side contact surface" denotes the sum of the respective surface areas enclosed by the outer boundaries of the individual first sub-regions. The surface area of the front-side contact surface is the difference between the total surface area and the surface area of the second sub-region of the front-side main face. In the present context, the surface area of the front-side contact surface, the surface area of the second sub-region, and the total surface area of the front-side main face each refer to the surface areas of the projections of the corresponding areas on a plane that is parallel to the main plane of extension of the semiconductor layer sequence. A topography that differs from that of a plane surface—due, for instance, to structuring of the front-side main face for the purposes of improving the light output—is not taken into account.

The inventors have discovered that with a first sub-region or—if there are multiple openings—with a plurality of first sub-regions that altogether cover 5% or more and in particular 15% or less of the total surface area of the front-side main face, a particularly high overall electro-optical efficiency is achieved for the semiconductor body.

In one embodiment, the optoelectronic semiconductor body is a thin-film light emitting diode chip. A basic principle of a thin-film light emitting diode chip is described, for example, in I. Schnitzer et al., Appl. Phys. Lett. 63 (16), Oct. 18, 1993, pages 2174-2176, the disclosure content of which is hereby incorporated by reference. Examples of thin-film light-emitting diode chips are described in documents EP 0905797 A2 and WO 02/13281 A1, the disclosure contents of which in this respect are also hereby incorporated by reference.

A thin-film light emitting diode chip is, to a good approximation, a lambertian surface radiator, and is therefore, for example, well-suited to application in a spotlight, such as a vehicle headlight.

The thin-film light emitting diode chip is characterised in one embodiment by a least one, and in particular by all, of the following features:

- a mirror layer is applied to or formed at a rear-side main face, opposite the front-side main face, of the semiconductor layer sequence, the semiconductor layer sequence being, in particular, a radiation-generating epitaxial layer sequence, said mirror layer reflecting at least a portion of the electromagnetic radiation generated in the semiconductor layer sequence back into the latter;
- the thin-film light emitting diode chip comprises—preferably at the rear side—a carrier element which is not the growth substrate on which the semiconductor layer sequence was epitaxially grown, but is a separate carrier element which is attached later to the semiconductor layer sequence;
- the semiconductor layer sequence has a thickness in the range of 10 µm or less, in particular in a range of 5 µm or less;
- the semiconductor layer sequence is free from a growth substrate. "Free from a growth substrate" means here that a growth substrate that may have been used for the growth of the semiconductor layer sequence has been removed or at least greatly thinned. In particular it has been thinned such that it is not self-supporting either alone or together with the epitaxial layer sequence. Any remainder of the heavily thinned growth substrate is in particular not suitable for functioning as a growth substrate; and
- the semiconductor layer sequence contains at least one semiconductor layer with at least one face that incorporates an intermixing structure which, in an ideal case, produces an approximately ergodic distribution of the light in the semiconductor layer sequence, i.e. it has a highly ergodic, stochastic scattering behaviour.

In the manufacture of the semiconductor body as a thin-film light emitting diode chip, the formation of the opening in such a way that it entirely penetrates through the semiconductor layer sequence can be particularly advantageous. In a thin-film semiconductor chip with an opening that passes from the rear towards the front through the semiconductor layer sequence, but that does not fully penetrate it, there is a relatively high risk of damaging the semiconductor layer sequence when the growth substrate is removed. In contrast to semiconductor bodies in accordance with the present application, a comparably high thickness of the semiconductor layer sequence is necessary in that kind of semiconductor body.

Semiconductor bodies according to the present application can advantageously comprise a semiconductor layer sequence of particularly low thickness. In one embodiment, the semiconductor layer sequence has a thickness of 3 µm or less, for example of 1 µm or less. In one further development it has a thickness of 500 nm or less.

In this way the time necessary to manufacture the semiconductor layer sequence becomes particularly short. The manufacture of the semiconductor body is therefore particularly economical. A thickness that is this low is, for example, also particularly advantageous for an embodiment in which the semiconductor layer sequence has a structuring in the form of a photonic crystal. In addition, a layer thickness that is this low is advantageous for a semiconductor layer sequence whose front-side main face and/or rear-side main face has a structuring that extends as far as the active layer or that even cuts through the active layer. With this kind of structuring it is possible to exploit what is known as the Purcell effect, by means of which an increase of the emission rate from the active layer can be achieved. Structures representing a photonic crystal or structures by means of which the Purcell effect can be exploited are known in principle to the person skilled in the art, and for that reason are not explained here in more detail. In combination with a semiconductor body of low layer thickness, particularly high optical efficiency can be achieved by means of a structuring of this type.

In one embodiment of the semiconductor body, the first sub-region of the front-side main face of the semiconductor layer sequence, which first sub-region is covered by an end part of the first section of the first electrical contact layer, encloses the at least one opening. Expressed differently, the first sub-region in this embodiment has an outer boundary which, in top view of the front-side main face, runs all the way around the opening. In particular, the first sub-region surrounds the opening in a ring-like fashion in top view of the front side. For example, in top view of the front side, the first sub-region has an—at least substantially—circular, elliptical, or n-gonal outer boundary, where in the case of an n-gonal outer boundary, n≥3. An inner boundary of the first sub-region is formed, for example, by a front-side edge of the opening. In a further development the semiconductor layer sequence has a number of openings, each of which is enclosed by a first sub-region.

In one embodiment, the section of the first electrical contact layer fills—especially together with the electrical separating layer—the opening entirely or at least almost entirely.

In another embodiment, the semiconductor body has at least one recess that laterally overlaps the at least one opening in the semiconductor layer sequence and which extends from the front side towards the rear into the semiconductor layer sequence. In particular the recess constitutes a sub-region of the opening. The recess is free from the material of the semiconductor layer sequence and from the material of the first electrical contact layer. Preferably, the recess is free from solid material. Alternatively it can be filled by an encapsulating material such as a silicone material or an epoxy resin.

In an expedient further development of this embodiment, the first electrical contact layer, in particular the section of the first electrical contact layer, borders the recess laterally and/or in direction towards the rear side. In particular, the first electrical contact layer comprises the recess. For example, a bottom part of the section fills a sub-region of the opening proximal to the rear side. Alternatively or in addition, a central part of the section runs in the form of a ring around a middle region of the opening. The central region of the opening, which particularly is open to the front side, is in particular free from the first electrical contact layer, and forms the recess. In particular the recess is free from solid material. Alternatively the recess—for instance on a semiconductor body that is mounted in an optoelectronic component—is filled with an encapsulating material such as epoxy resin or a silicone material.

The first electrical contact layer is expediently different from the semiconductor layer sequence, and is preferably free from semiconductor material. In particular it comprises, at least in some regions, a metal such as silver, gold, aluminum and/or copper, or consists of at least one of these metals.

In one further development, the first electrical contact layer is, at least in some regions, designed in a translucent or transparent fashion. For example, the section which extends through the opening, or at least one or more parts of that section, are translucent or transparent. In particular, at least the end part of the section, which end part covers the first sub-region of the front-side main face, is translucent or transparent. For example, the section or the transparent part(s) of the section comprise a transparent conductive oxide such as indium-tin oxide (ITO), or consist of it. A translucent section can, for example be particularly advantageous for the outcoupling efficiency if the semiconductor body has, in the region of the opening, a recess which is bordered by the section.

In another further development a further, rear-side section, different from the section which runs through the opening, of the first electrical contact layer comprises or consists of a metal. A particularly high overall efficiency can be achieved for the semiconductor body by means of a first electrical contact layer which is translucent at least in some regions and, in particular, does not cover a second sub-region of the front-side main face.

In another embodiment, the front-side main face of the semiconductor layer sequence comprises radiation out-coupling structures. In the present context, "radiation out-coupling structures" shall mean protrusions or depressions which are designed to improve the outcoupling of electromagnetic radiation generated in the active layer by means of scattering. In one expedient embodiment, radiation outcoupling structures have dimensions in the range of one wavelength of an emission maximum of the semiconductor layer sequence. For example, neighbouring protrusions or neighbouring depressions have an average spacing and/or an average height of greater than or equal to 100 nm, preferably of greater than or equal to 300 nm. In particular their average spacing and/or their average height is less than or equal to 1.5 µm, preferably less than or equal to 1 µm, particularly preferably less than or equal to 500 nm. Such out-coupling structures are known to the person skilled in the art in principle, and they are therefore not explained here in any more detail.

In one preferable further development, the first sub-region is free from the radiation out-coupling structures. In particular, the first sub-region is not intentionally provided with structures. For example, the first sub-region of the front-side main face is a smooth surface, especially a plane surface.

The inventors have discovered that a particularly good electrical conductivity of the end part of the first electrical contact layer can be achieved with a first sub-region that is free from radiation out-coupling structures. If the first sub-region has radiation out-coupling structures, there is a risk that the lateral distribution of current in the end part is unsatisfactory. A first sub-region which is free from radiation out-coupling structures is particularly advantageous for a semiconductor body which is operated with an operating current of 100 mA or more, in particular of 500 mA or more, for example of 1 A or more, relative to a surface area of the front-side main face of one square millimeter.

In an expedient embodiment, the semiconductor body has a second electrical contact layer which is also arranged on its rear side and which is electrically insulated from the first electrical contact layer by means of the separating layer or of further separating layer. In an expedient embodiment, the semiconductor body is contacted by means of the first electrical contact layer on its n-side and by means of the second electrical contact layer on its p-side, or vice versa. The semiconductor body having the first and the second electrical contact layers can be provided for externally electrically connecting both its n-side and its p-side from the rear side. The first and/or second electrical contact layers can be drawn laterally beside the semiconductor layer sequence. In this way the first and/or second electrical contact layer can be suitable for making external electrical contact from the front side.

In an expedient further development, the first electrical contact layer, the second electrical contact layer and the separating layer overlap laterally at the rear side of the semiconductor body. An embodiment of this sort is, for example, expedient for a semiconductor body with a plurality of openings in its semiconductor layer sequence, in order to form the first electrical contact layer in such a way that the sections which extend into the openings are electrically conductively connected at the rear side of the semiconductor body. The electrically conductive connection is, in particular, established by means of the rear-side section of the first electrical contact layer.

In a further embodiment, a semiconducting or electrically insulating mirror layer is arranged, at least in some regions, between the semiconductor layer sequence and the second electrical contact layer and/or between the semiconductor layer sequence and the first electrical contact layer. By means of the mirror layer a portion of the electromagnetic radiation that is emitted by the active layer in the direction towards the rear side is advantageously emitted in the direction of the front side. A particularly high efficiency can be achieved in this way for the out-coupling of the radiation.

In an expedient further development, the semiconducting or electrically insulating mirror layer has a plurality of apertures. The semiconductor layer sequence in top view of the rear side of the semiconductor body, is, in particular, not covered by the mirror layer in the region of the apertures. The second electrical contact layer expediently extends through the apertures to the semiconductor layer sequence. An electrical connection is established in this way between the second electrical contact layer and the semiconductor layer sequence through the electrically insulating or semiconducting mirror layer.

In a further embodiment, the at least one opening tapers in the direction from the front side towards the rear side. Expressed differently, the opening has a larger cross-section at the front side than it does at the rear side. In this way—in particular in an embodiment in which the central region of the opening is free from the first electrical contact layer, and where the semiconductor body has a recess in this region—electromagnetic radiation may be coupled out particularly well from the edges of the recess.

In another embodiment, the opening tapers in the direction from the rear side to the front side. An embodiment of this sort is particularly advantageous if the recess is entirely filled up by the first electrical contact layer.

In an alternative embodiment, the ring-shaped circumferential side face of the opening, or the side faces of the opening, run substantially perpendicular to a main plane of extension of the semiconductor layer sequence.

BRIEF DESCRIPTION OF THE DRAWINGS

Further advantages, advantageous embodiments and further developments of the semiconductor body result from the exemplary embodiments explained in connection with FIGS. 1 to 6.

In the figures.

DETAILED DESCRIPTION OF THE DRAWINGS

In the exemplary embodiments and the figures, similar or similarly acting elements are provided with the same reference symbols. The figures, and the size relationships of the elements illustrated in the figures, are not to be considered as being true to scale unless a scale is shown explicitly. Rather, individual elements, such as layers, can be illustrated with an exaggerated size or thickness in order to improve the representability and/or comprehensibility of the figures.

Figure 1:
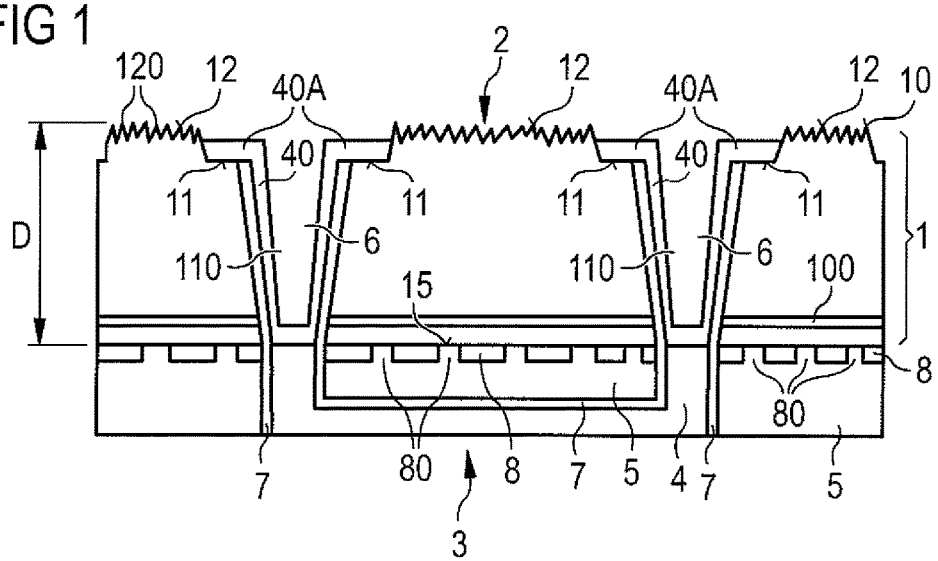
FIG. 1 shows a schematic sectional view of an optoelectronic semiconductor body in accordance with a first exemplary embodiment.

FIG. 1 shows a first exemplary embodiment of an optoelectronic semiconductor body. The optoelectronic semiconductor body incorporates an epitaxial semiconductor layer sequence 1, from which the growth substrate has been separated. A front-side main face 10 of the semiconductor layer sequence 1 arranged at the front side 2 of the semiconductor body is provided for the outcoupling of radiation. At a rear side 3, opposite the front side 2, a dielectric mirror layer 8 is applied to the rear-side main face 15 of the semiconductor layer sequence 1. Between the front-side main face 10 and the rear-side main face 15, the semiconductor layer sequence 1 contains an active layer 100 which is provided for generating electromagnetic radiation. In the present case the semiconductor layer sequence 1 has a thickness D of 1 μm. The thickness is the dimension from the rear-side main face 15 to the front-side main face 10, in this case.

The semiconductor layer sequence 1 has a plurality of openings 110 of which FIG. 1 only shows two for the sake of simplicity. The openings 110 penetrate all the way through the semiconductor layer sequence 1 in the direction from the front side 2 to the rear side 3. In particular, they penetrate through the active layer 100. The openings 110 are free from the material that constitutes the semiconductor layer sequence 1. In the present case they have a circular cross-section. In the semiconductor body of the first exemplary embodiment they taper in the direction from the front side 2 to the rear side 3.

A first electrical contact layer 4 is located at the rear side 3 of the semiconductor body. In each case one section 40 of the first electrical contact layer 4 extends into one opening 110 of the semiconductor layer sequence 1 starting from the rear side 3 and extending through the opening as far as the front side 2 of the semiconductor body, where an end part 40A of the section 40 covers a first sub-region 11 of the front side—more precisely of the front-side main face 10. The first sub-regions 11 surround the respective openings 110 in a ring-like fashion. A second sub-region 12 of the front-side main face 10 is not covered by the first electrical contact layer 4. The second sub-region 12 in the present case represents an exposed outer surface of the semiconductor body.

The second sub-region 12 in the present exemplary embodiment comprises light out-coupling structures 120. The first sub-regions 11, on the other hand, are free of the light out-coupling structures 12, and constitute plane parts of the surface.

Figure 4:
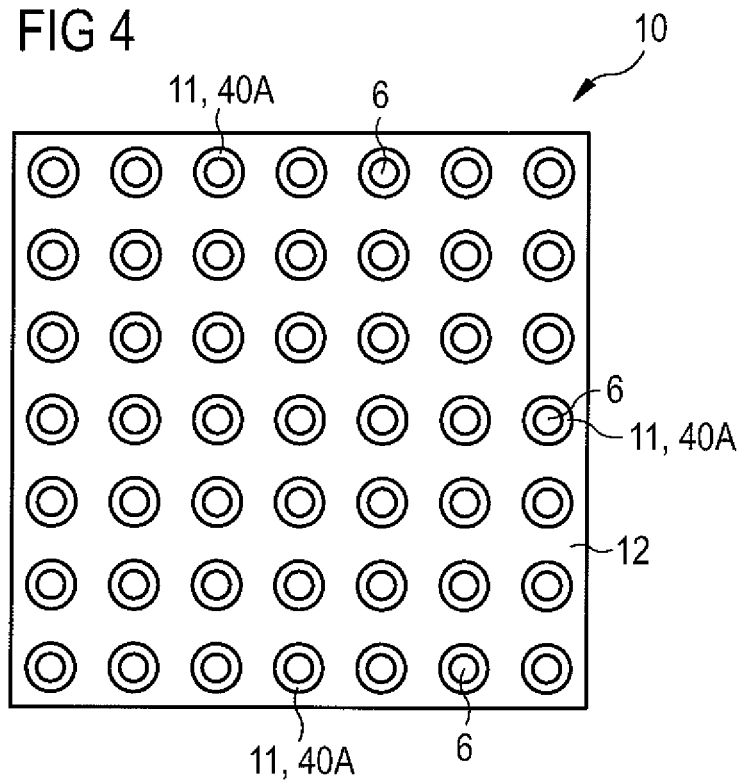
FIG. 4 shows a schematic top view of the optoelectronic semiconductor body according to the first exemplary embodiment.

This is shown in FIG. 4 for in a schematic top view of the front side 2 of the semiconductor body. The semiconductor layer sequence 1 has, for example, a square base area. The openings 110 are, for example, arranged in seven rows and seven columns—in particular at the intersection points of a square grid. The end parts 40A of the sections 40 of the first electrical contact layer 4, which sections pass through the openings 110, cover the first sub-regions 11 of the front-side main face 10 and the surround recesses 6. A second sub-region 12 is not covered by the first electrical contact layer 4.

The sections 40 of the first electrical contact layer 4 in the present exemplary embodiment do not completely fill the associated opening 110. Only a bottom part of the section 40 completely fills a rear sub-region of the opening 110. A middle part of the section 40 which follows in the direction towards the front side 2, and which is located in the region of the opening 110, only takes the form of a layer that covers the ring-shaped circumferential side face of the opening 110. The end part 40A of the section 40 adjoining the middle part in the direction of the front side 2 also has the shape of a ring. The section 40 in the present case thus has the form of a tube closed at the rear side by means of the bottom part, and having a collar at the front formed by the end part 40A. The middle part forms the side wall of the tube.

A middle part of the opening 110—open to the front side 2—is thus free from the material of the first electrical contact layer 4, and, in particular, is free from the material of the section 40 of the electrical contact layer 4. The recesses 6 of the semiconductor body, each of which extends in the region of an opening 110 from the front side 2 in the direction towards the rear side 3 into the semiconductor layer sequence 1, are formed in this way.

The section 40 of the first electrical contact layer 4 which extends through the opening 110 is, in the present case, transparent. It contains a transparent, conductive oxide such as indium-tin oxide (ITO) or consists of it.

A further, rear-side section of the first electrical contact layer 4, which in particular adjoins the section 40 in the direction of the rear side 3, preferably comprises a metallic material or consists of it. In the present case the first electrical contact layer consists of the transparent section 40 extending through the opening 110 and of the metallic rear-side section.

The section 40 is electrically insulated from the circumferential side face of the opening 110 by means of a separating layer 7. In the region of the opening 10, the separating layer 7 is, in a lateral direction, arranged between the section 40 and the semiconductor layer sequence 1. An electrical contact is, in contrast, established between the front-side main face 10 of the semiconductor layer sequence 1 and the end part 40A of the section 40.

The separating layer 7 in the present case also insulates the first electrical contact layer 4 from a second electrical contact layer 5 which is also arranged at the rear side 3 of the semiconductor body. The second electrical contact layer 5 extends from the rear side 3 through apertures 80 in the electrically insulating mirror layer 8 to the rear-side main face 15 of the semiconductor layer sequence 1. In the present case the first electrical contact layer is provided for connecting to the n-side of the semiconductor body, while the second electrical contact layer is provided for connecting to the p-side of the semiconductor body.

A sub-region of the first electrical contact layer 4, a sub-region of the separating layer 7, and a sub-region of the second electrical contact layer 5 overlap laterally at the rear side 3 of the semiconductor body. This is, for example, the case in the central region of FIG. 1, where the first electrical contact layer 4, the separating layer 7 and the second electrical contact layer 5 follow on one another in the direction from the rear side 3 to the front side 2. In this way the individual sections 40 which are located in the corresponding openings 110 of the semiconductor layer sequence 1 are electrically conductively connected to one another by means of the rear-side section of the first electrical contact layer 4.

In the present exemplary embodiment, the semiconductor body is designed for establishing an external electrical connection to its n-side and to its p-side from the rear side 3. Alternatively, the first electrical contact layer 4 and/or the second electrical contact layer 5 may be drawn laterally beside the semiconductor layer sequence 1, so that they are suitable for being connected from the front side. Embodiments of this sort are illustrated in association with the exemplary embodiments in FIGS. 2 and 3.

Figure 6:
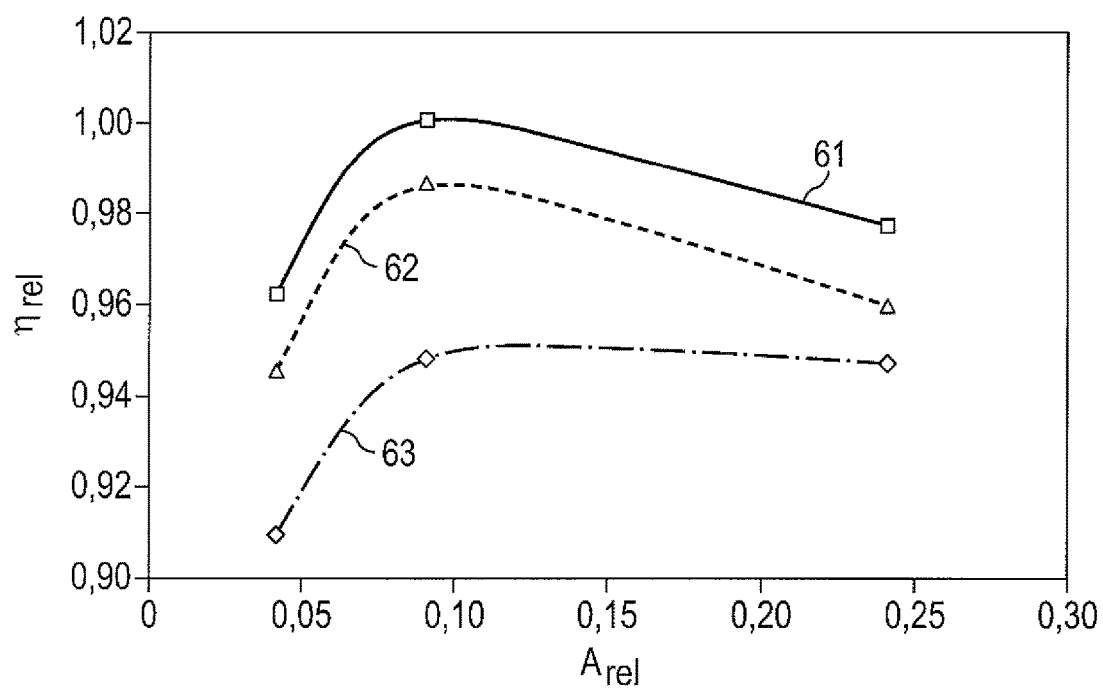
FIG. 6 shows the relative overall electro-optical efficiency of the semiconductor body according to the first exemplary embodiment against the coverage of a front-side main face by the first electrical contact layer.

FIG. 6 illustrates the relative overall electro-optical efficiency ηrel of the semiconductor body according to the first exemplary embodiments against the relative contact surface area Arel. The relative contact surface area here is the quotient of the surface area which is enclosed by the outer boundary of the first sub-regions 11 and the total surface area of the front-side main face 10 of the semiconductor layer sequence 1. The total surface area is the sum of the first sub-regions 11 and the second sub-regions 12. Each of these sub-regions is to be understood as a projection onto the main plane of extension of the semiconductor layer sequence 1, so that an increase in the true area—resulting, for example, from the protrusions which constitute the out-coupling structures 120—is not taken into account.

Three curves are illustrated in FIG. 6. Curve 61 describes the overall electro-optical efficiency ηrel for the case of planar first sub-regions 11, which are covered by an end part 40A of the first electrical contact layer 4, the end part being 100 nm thick and consisting of ITO. In the case of curve 62, the first sub-regions 11 are also planar, but 30 nm has been chosen as the thickness of the end part 40A. In curve 63, the first sub-regions 11 have, for the sake of comparison, out-coupling structures 120; the thickness of the end part 40A on which the out-coupling structures of the first sub-region 11 are applied is 100 nm in the case illustrated in curve 63.

It can clearly be seen from these calculations that with planar first sub-regions 11, the overall electro-optical inefficiency $\eta_{rel}$ is increased in comparison with roughened first sub-regions. A maximum of overall electro-optical efficiency is found at a relative contact area $A_{rel}$ between 5% and 15%, preferably between 7% and 12%. A preferable layer thickness for the end part 40A of the first electrical contact layer is between 30 nm and 100 nm.

Figure 2:
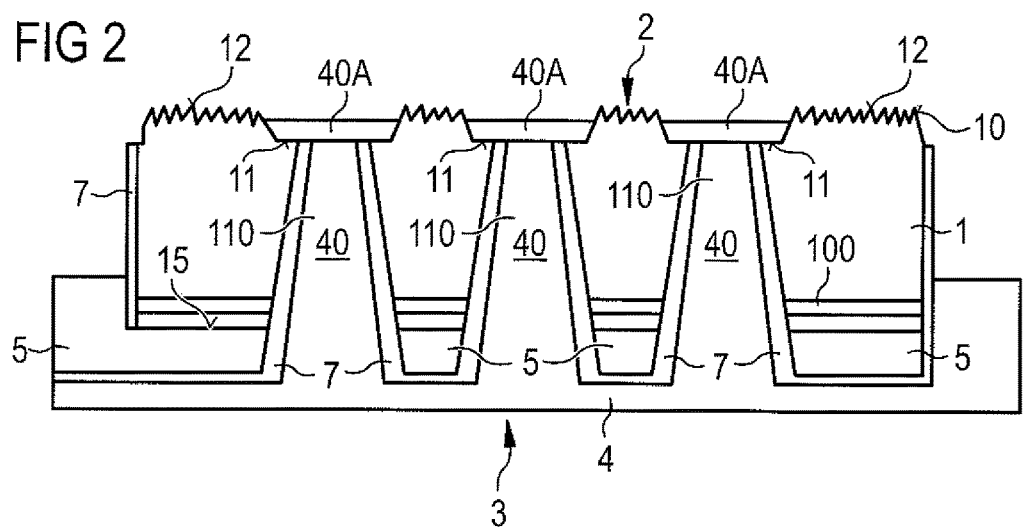
FIG. 2 shows a schematic sectional view of an optoelectronic semiconductor body in accordance with a second exemplary embodiment.

FIG. 2 shows a second exemplary embodiment of an optoelectronic semiconductor body. The optoelectronic semiconductor body according to the second exemplary embodiment differs initially from that of the first exemplary embodiment in that both the first and the second electrical contact layers 4, 5, are drawn laterally beside the semiconductor layer sequence 1. In this way, the semiconductor body is suitable for externally connecting its n-side and its p-side from its front side 2. The semiconductor body can also be designed for externally connecting its n-side and its p-side from its rear side 3, as has been explained in connection with the first exemplary embodiment.

The semiconductor body according to the second exemplary embodiment further differs from that of the first exemplary embodiment in that the sections 40 of the first electrical contact layer 4 which sections extend through the openings 110 in each case completely fill the openings 110. In the present case, the sections 40 consist of a metallic material in the region of the openings 110. Only the end parts 40A which cover the first sub-regions 110 of the front-side main face 10 consist of a transparent, conductive oxide such as ITO. The end parts 40A in the present case are also not ring-shaped, as in the first exemplary embodiment, but have the form of a full cylinder or, in one variant, of a cuboid. Each end part 40A in particular adjoins a front-side end face of the metallic part of the section 40, entirely covers this end face, and laterally projects beyond it.

Figure 3:
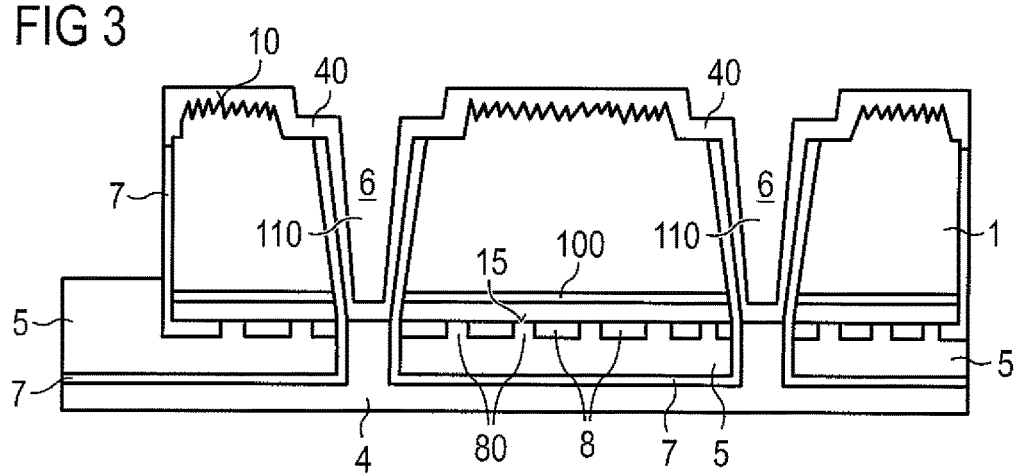
FIG. 3 shows a schematic sectional view of an optoelectronic semiconductor body in accordance with a third exemplary embodiment.

FIG. 3 shows a third exemplary embodiment of an optoelectronic semiconductor body. The third exemplary embodiment essentially corresponds with the first exemplary embodiment. A difference is that the second electrical contact layer is designed for establishing an external electrical connection from the front side, whereas the first electrical contact layer 4 is designed for establishing an external electrical connection from the rear side. A configuration of this sort for the external electrical connections is also suitable for the other exemplary embodiments.

In addition, in the semiconductor body according to the third exemplary embodiment, the first electrical contact layer 4, for example, entirely covers the front-side main face 10 of the semiconductor layer sequence 1. In particular, in the present case the radiation-transmissive section 40 which extends through the openings 110 and which contains, for example, ITO (indium-tin oxide) or consists of it, extends over the whole of the front-side main face 10. Such an embodiment can, for example, be advantageous when the semiconductor body is designed for operation with a particularly high operating current. It is alternatively possible, as in the first exemplary embodiment, for a sub-region 12 of the front-side main face 10 to be uncovered by the first electrical contact layer 4.

Figure 5:
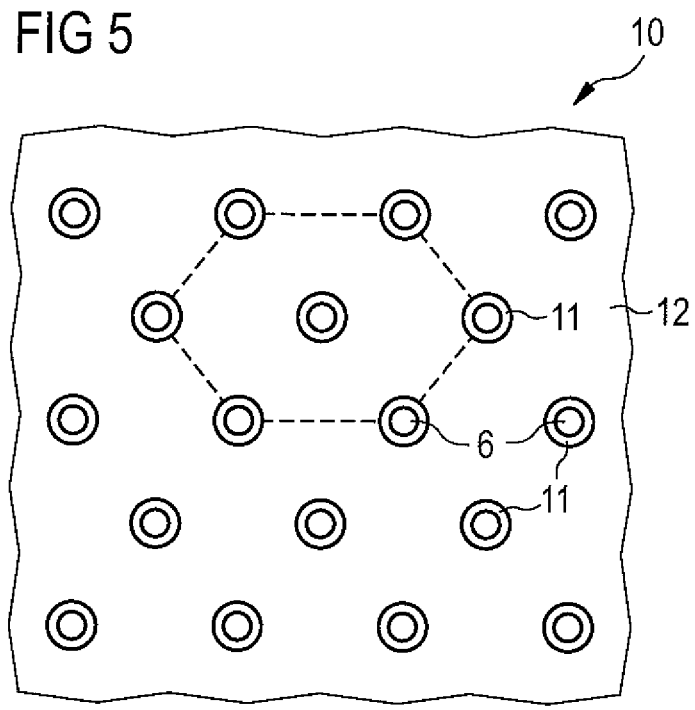
FIG. 5 shows a schematic top view of a part of an optoelectronic semiconductor body according to a variation of the first embodiment.

FIG. 5 shows a schematic top view of a part of the front-side main face 10 of a semiconductor body according to a variant of the first exemplary embodiment. In contrast to the first exemplary embodiment, the openings 110, with the first sub-regions 11 of the front-side main face 10 that surround them in the shape of a ring, are not arranged at the intersection points of a rectangular grid. Instead, they are located at the intersections of a hexagonal grid, indicated by the dashed lines in FIG. 5.

A particularly homogenous current distribution can be achieved by means of such an arrangement. This is especially advantageous when the semiconductor body has a large number of openings 110—for example, 100 openings or more.

The invention is not restricted to the exemplary embodiments by means of the description based on the exemplary embodiments. It rather comprises any new feature or any combination of features, even when this feature or this combination has not been explicitly specified in the exemplary embodiments and/or in the patent claims.

The invention claimed is:

1. An optoelectronic semiconductor body, comprising:
a semiconductor layer sequence comprising exactly one contiguous active layer suitable for generation of electromagnetic radiation; and
a first electrical contact layer, wherein:
the optoelectronic semiconductor body is a thin-film light emitting diode chip comprising a carrier element which is different from a growth substrate of the semiconductor layer sequence, the active layer comprises a multi quantum well structure to generate electromagnetic radiation;
the optoelectronic semiconductor body is configured to emit the electromagnetic radiation from a front side;
the semiconductor layer sequence comprises a plurality of openings that penetrate fully through the semiconductor layer sequence, including the exactly one active layer, in a direction from the front side to a rear side that is opposite the front side;
the first electrical contact layer is arranged at the rear side of the optoelectronic semiconductor body;
an end section of the first electrical contact layer extends from the rear side within the openings to the front side and covers a first sub-region of a front-side main face of the semiconductor layer sequence;
a second sub-region of the front-side main face is not covered by the first electrical contact layer;
the first electrical contact layer consists of a light-transmissive, electrically conductive material at least in the end section extending from the rear side within the openings to the front side and covering the first sub-region of the front-side main face of the semiconductor layer sequence;
the optoelectronic semiconductor body further comprises a second electrical contact layer that is also located at the rear side and that is electrically insulated from the first electrical contact layer by a separating layer;
the first electrical contact layer, the second electrical contact layer and the separating layer overlap laterally in a region of the rear side of the optoelectronic semiconductor body; and
within the openings, the separating layer is, in a lateral direction, arranged between the light-transmissive, electrically conductive material of the first electrical contact layer and the semiconductor layer sequence.

2. The optoelectronic semiconductor body according to claim 1, wherein, in plan view onto the front-side main face, the first sub-region surrounds the at least one opening.

3. The optoelectronic semiconductor body according to claim 1, wherein the light-transmissive, electrically conductive material completely fills up the openings.

4. The optoelectronic semiconductor body according to claim 1, further comprising:
a recess which laterally overlaps the opening and extends into the semiconductor layer sequence from the front side in the direction towards the rear side.

5. The optoelectronic semiconductor body according to claim 4, wherein the first electrical contact layer bounds the recess at least one of laterally and in the direction towards the rear side.

6. The optoelectronic semiconductor body according to claim 5, wherein the first electrical contact layer has the recess.

7. The optoelectronic semiconductor body according to claim 1, wherein the light-transmissive, electrically conductive material comprises a transparent conductive oxide.

8. The optoelectronic semiconductor body according to claim 7, wherein the transparent conductive oxide is an indium-tin oxide.

9. The optoelectronic semiconductor body according to claim 1, wherein the front-side main face comprises radiation outcoupling structures, and the first sub-region is free from the radiation outcoupling structures.

10. The optoelectronic semiconductor body according to claim 1, wherein a semiconducting or electrically insulating mirror layer having a plurality of apertures is arranged in some regions between the semiconductor layer sequence and the second electrical contact layer, and wherein the second electrical contact layer extends through each of the plurality of apertures to the semiconductor layer sequence.

11. The optoelectronic semiconductor body according to claim 1, wherein the semiconductor layer sequence has a thickness of 3 µm or less.

12. The optoelectronic semiconductor body according to claim 1, wherein a quotient of a surface area of a front-side contact surface and a total surface area of the front-side main face has a value greater than or equal to 0.05 and less than or equal to 0.15, wherein the surface area of the front-side contact surface is equal to a difference between the total surface area of the front-side main face and a surface area of the second sub-region.

13. The optoelectronic semiconductor body according to claim 1, wherein the openings taper in the direction from the front side towards the rear side.

14. The optoelectronic semiconductor body according to claim 1, wherein the semiconductor layer sequence is free of a growth substrate.

15. The optoelectronic semiconductor body according to claim 1, wherein the separating layer is integrally formed and free of interfaces.

16. The optoelectronic semiconductor body according to claim 1, wherein the separating layer consists of only one material.

17. The optoelectronic semiconductor body according to claim 1, wherein:
the separating layer is integrally formed and contains only one material;
a quotient of a surface area of a front-side contact surface and a total surface area of the front-side main face has a value greater than or equal to 0.05 and less than or equal to 0.15, wherein the surface area of the front-side contact surface is equal to the difference between the total surface area and the surface area of the second sub-region;
the separating layer consists of silicon dioxide or a silicon nitride;
the front-side main face comprises radiation outcoupling structures which completely cover the second sub-region, the first sub-region is free from the radiation outcoupling structures, the first and second sub-regions directly adjoin one another;
a rear-side section of the first electrical contact layer consists of a metallic material; and
the end section of the first electrical contact layer completely fills each of the openings so that a bottom part of the end section completely fills a rear sub-region of each opening, and so that the end section forms a layer that covers a ring-shaped circumferential side face of each opening in the direction of the front side.

18. The optoelectronic semiconductor body according to claim 17,
wherein the openings are cone-shaped and broaden in a direction away from the carrier element, wherein the end sections of the first electrical contact layer, in the direction toward the carrier element, terminate flush with the semiconductor layer sequence and directly adjoin the rear-side section of the first electrical contact layer, wherein said metallic rear-side section is a contiguous layer that electrically contacts all end sections, wherein the first sub-regions are planar and are ring-shaped when seen on the front side, and wherein a side of the end sections located in the first sub-regions and remote from the carrier element is on average located nearer to the carrier element than a top face of the radiation outcoupling structures facing away from the carrier element.

19. The optoelectronic semiconductor body according to claim 1, wherein the light-transmissive, electrically conductive material of the first electrical contact layer in the end section extending from the rear side within the openings to the front side and covering the first sub-region of the front-side main face of the semiconductor layer sequence has a thickness of between 30 nm and 100 nm.

* * * * *